(12) United States Patent
Tamura et al.

(10) Patent No.: US 7,757,862 B2
(45) Date of Patent: Jul. 20, 2010

(54) SEMICONDUCTOR CHIP HOUSING TRAY

(75) Inventors: Ryohei Tamura, Chino (JP); Tomoyuki Shindo, Fujimi-machi (JP); Hironori Ota, Chino (JP); Kazuo Yazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 28 days.

(21) Appl. No.: 12/171,945

(22) Filed: Jul. 11, 2008

(65) Prior Publication Data

US 2009/0050519 A1 Feb. 26, 2009

(30) Foreign Application Priority Data

Aug. 20, 2007 (JP) ............... 2007-213519

(51) Int. Cl.
*B65D 85/00* (2006.01)
(52) U.S. Cl. .............. 206/725; 206/722; 206/503
(58) Field of Classification Search ................ 206/712, 206/725, 722, 716, 701, 564, 726, 511, 503
See application file for complete search history.

(56) References Cited

U.S. PATENT DOCUMENTS

| 5,418,692 | A | * | 5/1995 | Nemoto | ............... | 361/809 |
| 5,481,438 | A | * | 1/1996 | Nemoto | ............... | 361/810 |
| 7,163,104 | B2 | * | 1/2007 | Inoke et al. | ............... | 206/726 |
| 7,504,315 | B2 | * | 3/2009 | Matsubara et al. | .......... | 438/455 |
| 2002/0003101 | A1 | * | 1/2002 | Sembonmatsu et al. | ..... | 206/726 |
| 2002/0066694 | A1 | * | 6/2002 | Soh et al. | ............... | 206/725 |
| 2003/0209466 | A1 | * | 11/2003 | Kunii et al. | ............... | 206/725 |

FOREIGN PATENT DOCUMENTS

| JP | A-10-211986 | | 8/1998 |
| JP | 2001097350 | A * | 4/2001 |
| JP | 2006100297 | A * | 4/2006 |
| JP | 2006176162 | A * | 7/2006 |
| JP | A-2007-109763 | | 4/2007 |

* cited by examiner

*Primary Examiner*—David T Fidei
(74) *Attorney, Agent, or Firm*—Oliff & Berridge PLC

(57) ABSTRACT

A semiconductor chip housing tray that is used in a state of being stacked in a plurality of stages and houses a plurality of semiconductor chips, includes: a base plate; a plurality of upper surface protruding parts provided to an upper surface of the base plate and dividing the upper surface of the base plate into a plurality of first semiconductor chip housing areas; and a plurality of under surface protruding parts provided to an under surface of the base plate and dividing the under surface of the base plate into a plurality of second semiconductor chip housing areas. In the semiconductor chip housing tray, a margin width of the first semiconductor chip housing areas with respect to the semiconductor chips is smaller than a margin width of the second semiconductor chip housing areas with respect to the semiconductor chips.

7 Claims, 7 Drawing Sheets

SEMICONDUCTOR CHIP HOUSING TRAY

The entire disclosure of Japanese Patent Application No. 2007-213519, filed Aug. 20, 2007 is expressly incorporated by reference herein.

BACKGROUND

1. Technical Field

The present invention relates to a semiconductor chip housing tray used in a state being stacked in a plurality of stages. In particular, the invention relates to a semiconductor chip housing tray suppressing damage on a semiconductor chip when a plurality of the semiconductor chip housing trays are stacked.

2. Related Art

Chip on glass (COG) is one of methods for mounting a semiconductor chip. This method mounts a semiconductor chip having a bump directly on a substrate, and is becoming mainstream of a method for mounting a driver IC on a liquid crystal panel, for example. A semiconductor chip having a bump is housed in a manner allowing its active face on which the bump is formed to face upside when it is transferred so as to prevent the bump from being damaged. On the other hand, the active face needs to face downside when the semiconductor chip is mounted by COG. Therefore, the semiconductor chip housing tray needs to be turned over when the semiconductor chip is taken out from the tray.

FIGS. 7A and 7B are sectional views for explaining a first example of a semiconductor chip housing tray in related art. A semiconductor chip housing tray 210 shown in the figures is used in pairs with a tray 220 for taking out. An upper surface of the semiconductor chip housing tray 210 is divided into a plurality of semiconductor chip housing areas by a protruding part 211. An under surface of the tray 220 is divided into a plurality of semiconductor chip housing areas by a protruding part 221.

As shown in FIG. 7A, when semiconductor chips 201 are transferred, the semiconductor chips 201 are respectively housed in the plurality of semiconductor chip housing areas of the semiconductor chip housing tray 210. Then a plurality of the semiconductor chip housing trays 210 are stacked. When the semiconductor chips 201 are taken out, the tray 220 is stacked on the semiconductor chip housing tray 210 that is positioned topmost. The protruding part 221 contacts the protruding part 211 in this state.

As shown in FIG. 7B, the semiconductor chip housing tray 210 that is positioned topmost and on which the tray 220 is stacked is removed from a semiconductor chip housing tray 210 that is positioned one stage lower. Then the stacked body of the semiconductor chip housing tray 210 and the tray 220 is turned over. Accordingly, the semiconductor chips 201 are moved to the semiconductor chip housing areas of the tray 220. In the turning over of the stacked body, the semiconductor chips 201 are reversed, so that the active faces of the chips 201 face underside. This process is shown in FIGS. 7 and 8 in JP-A-10-211986, for example.

FIGS. 5A and 5B are sectional views for explaining a second example of a semiconductor chip housing tray in related art. In a semiconductor chip housing tray 230 shown in the figures, an upper surface is divided into a plurality of semiconductor chip housing areas by a protruding part 232 and an under surface is also divided into a plurality of semiconductor chip housing areas by a protruding part 231.

As shown in FIG. 8A, when semiconductor chips 201 are transferred, the semiconductor chips 201 are respectively housed in the plurality of semiconductor chip housing areas provided on the upper surface of the semiconductor chip housing tray 230. Then, a plurality of the semiconductor chip housing trays 230 are stacked up in a manner allowing their upper surfaces to face upside. The protruding part 231 contacts the protruding part 232 in this state. This process is shown in FIG. 2 of JP-A-10-211986, for example.

As shown in FIG. 8B, when the semiconductor chips 201 are taken out, a stacked body of the semiconductor chip housing trays 230 is turned over. Accordingly, the semiconductor chips 201 are moved to the semiconductor chip housing areas provided to the under surface of the semiconductor chip housing trays 230. In the turning over of the stacked body, the semiconductor chips 201 are reversed, so that the active faces of the chips 201 face downside. After that, the semiconductor chip housing trays 230 are removed one by one.

However, the semiconductor chip housing trays according to the first example and the second example have had the following problems. First, the semiconductor chip housing tray of the first example requires the tray for taking out. Further, the processes described in reference to FIGS. 7A and 7B are required for each of the trays, increasing the number of processes.

In the semiconductor chip housing tray according to the second example, a distance between the under surface of a semiconductor chip housing tray that is positioned one stage upper and the semiconductor chip tends to be large. Therefore, in a case where a planar shape of a semiconductor chip is rectangular and its short side is short, the semiconductor chips are turned over in the semiconductor chip housing areas, whereby the two surfaces are disadvantageously reversed.

Distortion and warpage sometimes occur in a semiconductor chip housing tray. In this case, in the semiconductor chip housing trays of the first example and the second example, a gap is produced between a semiconductor chip housing tray positioned upper and a semiconductor chip housing tray positioned lower, so that a semiconductor chip is caught in the gap, causing damage thereof.

For solving the problems described above, a height of the protruding part on the upper surface and that on the under surface of the semiconductor chip housing tray according to the second example may be formed to be nearly half of the thickness of the semiconductor chips. However, this case impairs the settlement of the semiconductor chips in the semiconductor chip housing areas, so that the semiconductor chips pop out from the semiconductor chip housing areas due to some vibration or shock, damaging the semiconductor chips.

To the above problems, JP-A-2007-109763 discloses following semiconductor chip housing tray. When a plurality of the semiconductor chip hosing trays are stacked, a rib partially provided to an under surface of one semiconductor chip housing tray along boundaries of its housing areas engages with a rib partially provided to an upper surface of another semiconductor chip housing tray that is positioned one stage lower along boundaries of its housing areas. Accordingly, a distance between the under surface of the semiconductor chip housing tray that is positioned one stage upper and the semiconductor chip can be made short, and the semiconductor chips can be prevented from popping out from the housing areas.

In the semiconductor chip housing tray disclosed in JP-A-2007-109763, the rib partially provided to the under surface of the semiconductor chip housing tray along boundaries of its housing areas engages with the rib partially provided to the upper surface of the semiconductor chip housing tray that is positioned one stage lower along boundaries of its housing areas. Therefore, when the plurality of semiconductor chip housing trays are stacked, the rib provided on the under surface may damage the semiconductor chips housed in the semiconductor chip housing tray that is positioned one stage lower.

SUMMARY

An advantage of the present invention is to provide a semiconductor chip housing tray that prevents a semiconductor chip from being damaged when the tray is used in a state being stacked in a plurality of stages.

A semiconductor chip housing tray, according to a first aspect of the invention, that is used in a state of being stacked in a plurality of stages and houses a plurality of semiconductor chips, includes: a base plate; a plurality of upper surface protruding parts provided to an upper surface of the base plate and dividing the upper surface of the base plate into a plurality of first semiconductor chip housing areas, and a plurality of under surface protruding parts provided to an under surface of the base plate and dividing the under surface of the base plate into a plurality of second semiconductor chip housing areas. In the semiconductor chip housing tray, a margin width of the first semiconductor chip housing areas with respect to the semiconductor chips is smaller than a margin width of the second semiconductor chip housing areas with respect to the semiconductor chips. In a case where the semiconductor chip housing tray is used in a state being stacked in a plurality of stages, the plurality of second semiconductor chip housing areas nearly overlap the first semiconductor chip housing areas respectively, a bottom of a first under surface protruding part that is a part of the under surface protruding parts is free from facing any top of the plurality of upper surface protruding parts provided to the semiconductor chip housing tray that is positioned one stage lower, a top of a first upper surface protruding part that is a part of the upper surface protruding parts is free from facing any bottom of the plurality of under surface protruding parts provided to the semiconductor chip housing tray that is positioned one stage upper, each of a distance between the bottom of the first under surface protruding part and an upper surface of the semiconductor chip housing tray positioned one stage lower and a distance between a top of the first upper surface protruding part and an under surface of the semiconductor chip housing tray positioned one stage upper is smaller than a thickness of the semiconductor chips, and each of a height of the first under surface protruding part and a height of the first upper surface protruding part is larger than the thickness of the semiconductor chips.

According to the tray of the first aspect, the margin width of the first semiconductor chip housing areas with respect to the semiconductor chip is smaller than that of the second semiconductor chip housing areas with respect to the chip. Therefore, even if each of the distance between the bottom of a part of the under surface protruding parts and the upper surface of the semiconductor chip housing tray positioned one stage upper and the distance between the top of a part of the upper surface protruding parts and the under surface of the semiconductor chip housing tray positioned one stage lower is smaller than the thickness of the semiconductor chip, the part of the under surface protruding parts is prevented from damaging the semiconductor chips housed in the semiconductor chip housing areas of the tray positioned one stage lower.

In the semiconductor chip housing tray of the first aspect, a planar shape of the semiconductor chips may be rectangular. In the tray, the plurality of upper surface protruding parts may include a plurality of upper surface protruding parts for a long side that face a lateral surface at a long side of the semiconductor chips and a plurality of upper surface protruding parts for a short side that face a lateral surface at a short side of the semiconductor chips. The plurality of under surface protruding parts may include a plurality of under surface protruding parts for a long side that face a lateral surface at a long side of the semiconductor chips and a plurality of under surface protruding parts for a short side that face a lateral surface at a short side of the semiconductor chips. In the tray, a protruding part that is positioned closest to a short side of the semiconductor chips among the under surface protruding parts for a long side may be positioned closer to the short side of the semiconductor chips than a protruding part positioned closest to the short side of the semiconductor chips among the upper surface protruding parts for a long side.

In a case where the semiconductor chips are taken out from the semiconductor chip housing tray, the tray is turned over so as to house the semiconductor chips in the second semiconductor chip housing areas. According to the aspect, the under surface protruding parts for a long side are positioned closer to the short side of the semiconductor chips than the upper surface protruding parts for a long side, so that the semiconductor chips housed in the second semiconductor chip housing areas are prevented from spinning around in the horizontal plane. Therefore, when the semiconductor chips are taken out from the semiconductor chip housing tray, variation in angles of the semiconductor chips in the horizontal plane is suppressed.

In the semiconductor chip housing tray of the first aspect, a planar shape of the semiconductor chips may be rectangular. In the tray, the plurality of upper surface protruding parts may include a plurality of upper surface protruding parts for a long side that face a lateral surface at a long side of the semiconductor chips and a plurality of upper surface protruding parts for a short side that face a lateral surface at a short side of the semiconductor chips. The plurality of under surface protruding parts may include a plurality of under surface protruding parts for a long side that face a lateral surface at a long side of the semiconductor chips and a plurality of under surface protruding parts for a short side that face a lateral surface at a short side of the semiconductor chips. In the tray, each of a height of the plurality of under surface protruding parts for a short side and a height of the plurality of upper surface protruding parts for a short side may be smaller than a half of a distance between the under surface of the semiconductor chip housing tray and the upper surface of the semiconductor chip housing tray positioned one stage lower in a case where the semiconductor chip housing tray is used in a state being stacked in the plurality of stages. In a case where the semiconductor chip housing tray is used in the state being stacked in the plurality of stages, a bottom of the plurality of under surface protruding parts for a short side may face a top of the upper surface protruding parts for a short side of the semiconductor chip housing tray positioned one stage lower.

Accordingly, the upper surface protruding parts for a short side and the under surface protruding parts for a short side are not required to be positioned alternately. Therefore, the upper surface protruding parts for a short side and the under surface protruding parts for a short side can be provided even in a case where a short side of the semiconductor chips is short and a room for positioning the protruding parts for a short side is small.

In the semiconductor chip housing tray of the first aspect, each of the upper surface protruding parts and the under surface protruding parts may have a slanted lateral surface and a slant at an end part of the lateral surface may be looser than that at other parts of the lateral surface.

Accordingly, the semiconductor chips are easily housed in the first semiconductor chip housing areas. In addition, when the semiconductor chip housing tray is turned over, the semiconductor chips are easily housed in the second semiconductor chip housing areas.

In the semiconductor chip housing tray of the first aspect, any one of a protruding part, a concave part, and a cutout indicating a direction of the semiconductor chip housing tray may be provided to a periphery. Accordingly, the semiconductor chip housing tray is prevented from being stacked in a wrong direction, suppressing damage on the semiconductor chips housed in the semiconductor chip housing areas of a tray positioned one stage lower.

A method for housing a semiconductor chip in a semiconductor chip housing tray according to a second aspect of the invention, in which the semiconductor chip housing tray includes: a base plate, a plurality of upper surface protruding parts provided to an upper surface of the base plate and dividing the upper surface of the base plate into a plurality of first semiconductor chip housing areas, and a plurality of under surface protruding parts provided to an under surface of the base plate and dividing the under surface of the base plate into a plurality of second semiconductor chip housing areas, and the semiconductor chip housing tray includes a plurality of semiconductor chip housing trays composed of at least a first semiconductor chip housing tray and a second semiconductor chip housing tray, the method includes: housing a semiconductor chip to each of the first semiconductor chip housing areas provided to the first semiconductor chip housing tray; and stacking the second semiconductor chip housing tray on the first semiconductor chip housing tray. In the semiconductor chip housing tray used in the method, a margin width of the first semiconductor chip housing areas with respect to the semiconductor chip is smaller than a margin width of the second semiconductor chip housing areas with respect to the semiconductor chip. In addition, in a case where the first and second semiconductor chip housing trays are stacked, the plurality of second semiconductor chip housing areas provided to the second semiconductor chip housing tray nearly overlap the first semiconductor chip housing areas provided to the first semiconductor chip housing tray respectively, a bottom of a first under surface protruding part that is a part of the under surface protruding parts provided to the second semiconductor chip housing tray is free form facing any top of the plurality of upper surface protruding parts provided to the first semiconductor chip housing trays a top of a first upper surface protruding part that is a part of the upper surface protruding parts provided to the first semiconductor chip housing tray is free from facing any bottom of the plurality of under surface protruding parts provided to the second semiconductor chip housing tray, each of a distance between the bottom of the first under surface protruding part provided to the second semiconductor chip housing tray and the upper surface of the first semiconductor chip housing tray, and a distance between the top of the first upper surface protruding part provided to the first semiconductor chip housing tray and the under surface of the second semiconductor chip housing tray is smaller than a thickness of the semiconductor chip, and each of a height of the first under surface protruding part and a height of the first upper surface protruding part is larger than the thickness of the semiconductor chip.

BRIEF DESCRIPTION OF THE DRAWINGS

The invention will be described with reference to the accompanying drawings wherein like numbers reference like elements.

DESCRIPTION OF THE EXEMPLARY EMBODIMENTS

Embodiments of the invention will now be described with reference to the accompanying drawings.

First Embodiment

Figure 1A:
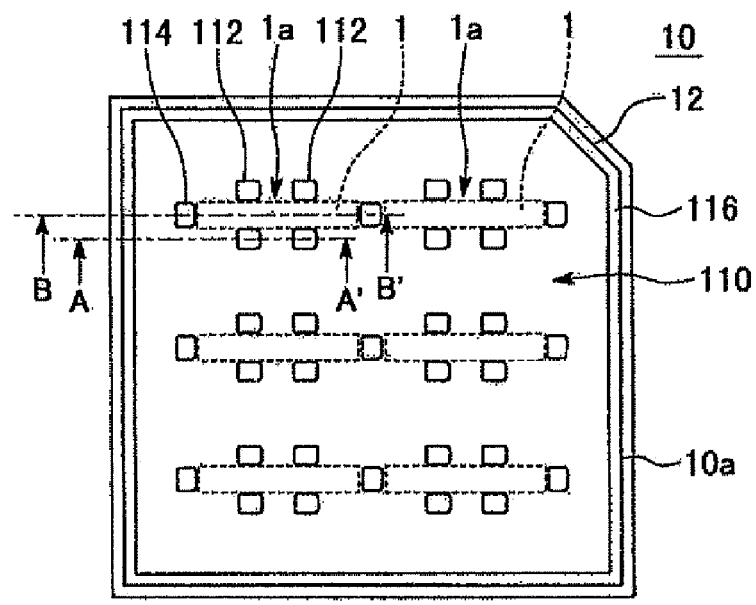
FIG. 1A is a diagram showing an upper surface of a semiconductor chip housing tray 10 according to a first embodiment.
Figure 1B:
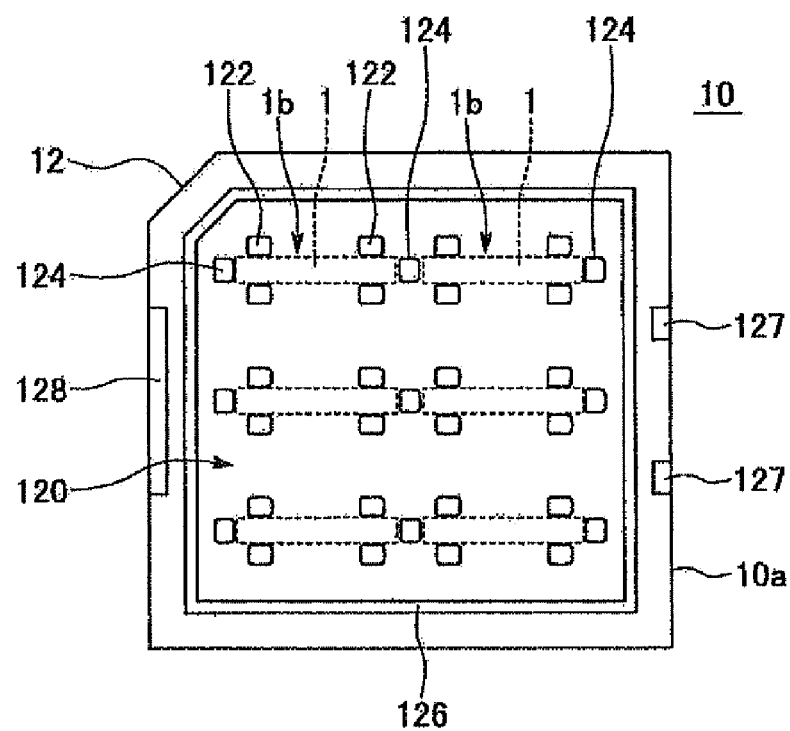
FIG. 1B is a diagram showing an under surface of the semiconductor chip hosing tray 10.

FIG. 1A is a diagram showing an upper surface of a semiconductor chip housing tray 10 according to a first embodiment, and FIG. 1B is a diagram showing an under surface of the semiconductor chip hosing tray 10. The semiconductor chip housing tray 10 is used for transferring a plurality of semiconductor chips 1 of which a planar view is rectangular in a manner housing them. When the semiconductor chips 1 are transferred, a plurality of the semiconductor chip housing trays 10 are stacked and then bound with a tray band. Hereinafter, an upper surface of the semiconductor chip housing tray 10 is defined to be a surface that faces upside in the transfer. In addition, an up and down relation is defined based on a case where the upper surface of the semiconductor chip housing tray 10 faces upside.

The semiconductor chip 1 is a display driver of a thin display, for example, and includes a bump on its active face. The semiconductor chip 1 is directly mounted on a substrate by a chip on glass (COG) method. The semiconductor chip 1 is housed at the upper surface of the semiconductor chip housing tray 10 in a manner allowing its active face on which the bump is formed to face upside when it is transferred so as to suppress damage on the bump. When the semiconductor chip 1 is taken out, a stacked body of the semiconductor chip housing trays 10 is reversed and the semiconductor chip housing trays 10 are removed one by one. Accordingly, the semiconductor chip 1 is taken out from each of the under surfaces of the plurality of semiconductor chip housing trays 10 in a manner allowing its active face to face downside.

To a periphery of the semiconductor chip housing tray 10, a cutout 12 indicating a direction of the semiconductor chip housing tray 10 is provided. Even if a worker chooses a wrong direction of the semiconductor chip housing trays 10 when the worker stacks the trays 10, the worker can not stack the trays 10 due to the cutout 12. As a result, the active face of the semiconductor chip 1 is prevented from being damaged. A protruding part or a concave part may be provided instead of the cutout 12.

As shown in FIG. 1A, the semiconductor chip housing tray 10 includes a rib 116 at the periphery of an upper surface of a base plate 10*a*, and a plurality of housing areas 1*a* for respectively housing the semiconductor chips 1 in an area surrounded by the rib 116. The housing areas 1*a* are separated from each other by a plurality of protruding parts 112 and a plurality of protruding parts 114. In particular, a planar shape of the plurality of housing areas 1*a* is rectangular and the housing areas 1*a* are arranged in matrix. Between housing areas 1*a* of which long sides are adjacent, two pieces of protruding parts 112 are disposed in a manner allowing their lateral surfaces to face a lateral surface at a long side of the semiconductor chip 1. Between housing areas 1*a* of which short sides are adjacent, one piece of protruding part 114 is disposed in a manner allowing its lateral surface to face a lateral surface at a short side of the semiconductor chip 1. The two pieces of protruding parts 112 are disposed at symmetric positions through the center of the long side of the housing area 1*a*, and the protruding part 114 is disposed such that the center thereof is opposed to the center of the short side of the semiconductor chip 1. Here, between housing areas 1*a* that are positioned outermost and the rib 116, protruding parts 112 and protruding parts 114 are disposed in the same layout as those between housing areas 1*a*.

As shown in FIG. 1B, the semiconductor chip housing tray 10 includes a rib 126 at the periphery of an under surface of the base plate 10*a*, and a plurality of housing areas 1*b* for respectively housing the semiconductor chips 1 in an area surrounded by the rib 126. The housing areas 1*b* are separated from each other by a plurality of protruding parts 122 and a plurality of protruding parts 124 in the same manner as the housing areas 1*a*. In particular, between housing areas 1*b* of which long sides are adjacent, two pieces of protruding parts 122 are disposed in a manner allowing their lateral surfaces to face a lateral surface at a long side of the semiconductor chip 1. Between housing areas 1*b* of which short sides are adjacent, one piece of protruding part 124 is disposed in a manner allowing its lateral surface to face a lateral surface at a short side of the semiconductor chip 1. The two pieces of protruding parts 122 are disposed at symmetric positions through the center of the long side of the housing area 1*b*, and the protruding part 124 is disposed such that the center thereof is opposed to the center of the short side of the semiconductor chip 1. Here, between housing areas 1*b* that are positioned outermost and the rib 126, protruding parts 122 and protruding parts 124 are disposed in the same layout as those between housing areas 1*b*.

When viewed from a direction orthogonal to the semiconductor chip housing tray 10, the housing areas 1*a* and 1*b* are positioned to overlap each other. The protruding parts 114 and 124 are positioned to overlap each other, while the protruding parts 112 and 122 are positioned not to overlap each other. In particular, the protruding parts 122 are positioned close to a short side of a housing area than the protruding parts 112, and a distance between the protruding part 122 and the center of the long side of the housing area 1*b* is larger than the distance between the protruding part 112 and the center of the long side of the housing area 1*a*. Therefore, it is harder for the semiconductor chip 1 housed in the housing area 1*b* to spin around in the horizontal plane than the semiconductor chip 1 housed in the housing area 1*a*.

At edges of the under surface of the semiconductor chip housing tray 10, grooves 127 and 128 are provided so as to prevent displacement of the tray band.

When viewed from a direction orthogonal to the semiconductor chip housing tray 10, the rib 126 provided to the under surface of the semiconductor chip housing tray 10 is positioned more inside than the rib 116 provided to the upper surface. In a case where a plurality of the semiconductor chip housing trays 10 are stacked as described later, the rib 126 provided to one semiconductor chip housing tray 10 is fit between the protruding parts 112 and 114 that are positioned outermost and the rib 116 of another semiconductor chip housing tray 10 that is positioned one stage lower. The housing areas 1*a* and 1*b* overlap each other.

Figure 2A:
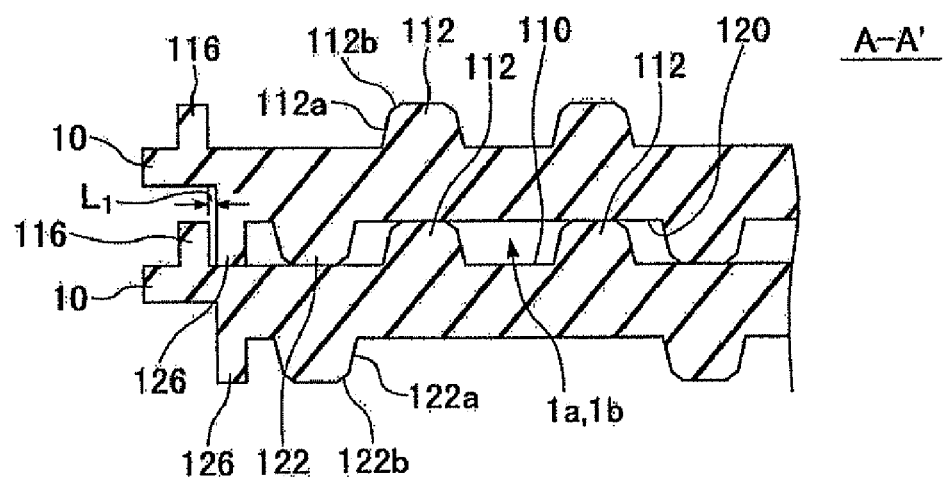
FIGS. 2A and 2B are sectional views showing a state that two pieces of semiconductor chip housing trays 10 are stacked.
Figure 2B:
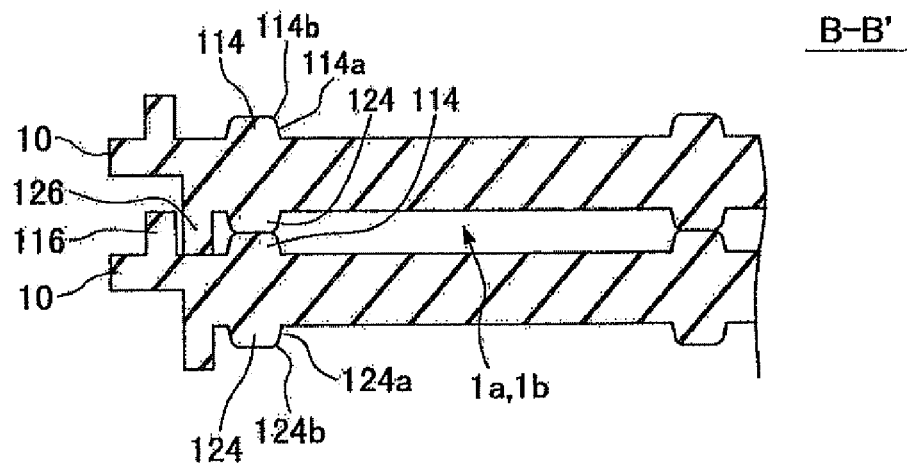

FIGS. 2A and 2B are sectional views showing a state that two semiconductor chip housing trays 10 are stacked. In particular, FIG. 2A is the sectional view taken along the line A-A' of FIG. 1A, and FIG. 2B is the sectional view taken along the line B-B' of FIG. 1A. Here, the semiconductor chip housing tray 10 that is positioned upper is referred to as a first semiconductor chip housing tray 10 or merely a first tray 10, and the semiconductor chip housing tray 10 that is positioned lower is referred to as a second semiconductor chip housing tray 10 or merely a second tray 10.

As shown in FIGS. 2A and 2B, the housing area 1*a* of the second semiconductor chip housing tray 10 nearly overlap the housing area 1*b* of the first semiconductor chip housing tray 10. When a stacked body of the first and second semiconductor chip housing trays 10 is reversed in order to take out the semiconductor chip 1, the semiconductor chip 1 that has been housed in the housing area 1*a* of the second tray 10 is housed in the housing area 1*b* of the first tray 10.

A bottom of the protruding parts 122 of the first tray 10 does not face any of the protruding parts 112 and 114 provided to the second tray 10 and a top of the protruding parts 112 of the second tray 10 does not face any of the protruding parts 122 and 124 provided to the first tray 10. As described above, the distance between the center of the long side of the housing area 1*b* and the protruding part 122 is larger than the distance between the center of the long side of the housing area 1*a* and the protruding part 112. Therefore, it is harder for the semiconductor chip 1 housed in the housing area 1*b* to spin around in the horizontal plane than the semiconductor chip 1 housed in the housing area 1*a*. Accordingly, when the semiconductor chip 1 is taken out from the tray 10 so as to be mounted by an automatic mounting device, a mounting angle of the semiconductor chip 1 in the horizontal plane is prevented from being out of an accepted rage.

In the protruding parts 112, 114, 122, and 124, respective lateral surfaces 112*a*, 114*a*, 122*a*, and 124*a* are slanted, and slants at respective end parts 112*b*, 114*b*, 122*b*, and 124*b* of the lateral surfaces are looser than those of other parts of the lateral surfaces. Accordingly, the semiconductor chip 1 is easily housed in the housing area 1*a*, and when the stacked body of the semiconductor chip housing trays 10 is reversed, the semiconductor chip 1 is easily housed in the housing area 1*b*.

As shown in FIG. 2A, the rib 126 of the first tray 10 is fit between the protruding parts 112 and 114 that are positioned outermost and the rib 116 of the second tray 10. A margin width L1 between a surface of the outer circumference of the rib 126 and a surface of the inner circumference of the rib 116 is, for example, 0.1 mm. In addition, the protruding parts 112 and 122 do not contact with each other, and two protruding parts 112 are positioned between two protruding parts 122.

The height of the rib 126 equals to each of the heights of the protruding parts 112 and 122 and the heights are larger than the thickness of the semiconductor chip 1. The top of the protruding part 112 provided to the upper surface of the second tray 10 contacts the under surface of the first tray 10, and the bottom of the protruding part 122 provided to the under surface of the first tray 10 contacts the upper surface of the second tray. Therefore, the distance between the upper surface of the second tray 10 and the under surface of the first tray 10 can be made smaller than the width of the semiconductor chip 1. Accordingly, even if the vibration is added to the trays 10, the semiconductor chip 1 housed in the housing area 1a can be prevented from turning over.

The top of the protruding part 112 of the second tray 10 and the bottom of the protruding part 122 of the first tray 10 are positioned differently in the height direction. Therefore, even if shock or vibration is added to the trays 10, the semiconductor chip 1 is prevented from slipping in between the second tray 10 and the first tray 10 and from popping out from the housing area 1a.

As shown in FIG. 2B, the top of the protruding part 114 provided to the upper surface of the second tray 10 contacts the bottom of the protruding part 124 provided to the first tray 10. Accordingly, the protruding parts 114 and 124 are not required to be positioned alternately, so that they can be provided even in a case where a short side of the semiconductor chip 1 is short and a room for positioning the protruding parts 114 and 124 is small.

In order to position the protruding parts 114 and 124 as this, a sum of the height of the protruding part 114 and the height of the protruding part 124 needs to be equal to each of the heights of the protruding parts 112 and 122. Preferably, the height of each of the protruding parts 114 and 124 is nearly half of each of the heights of the protruding parts 112 and 122.

Figure 3A:
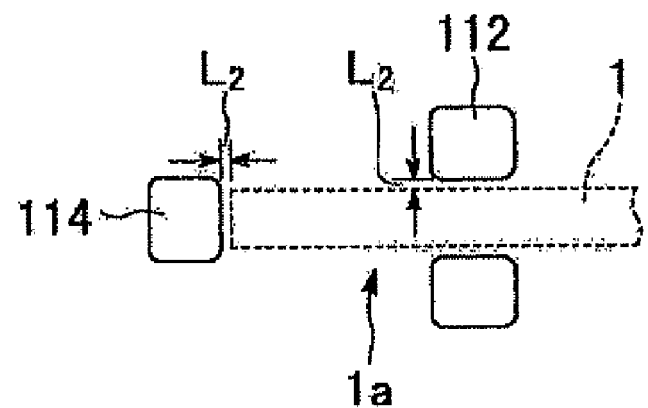
FIG. 3A is a plan view showing a part of a housing area 1a, and FIG. 3B is a plan view showing a part of a housing area 1b.
Figure 3B:
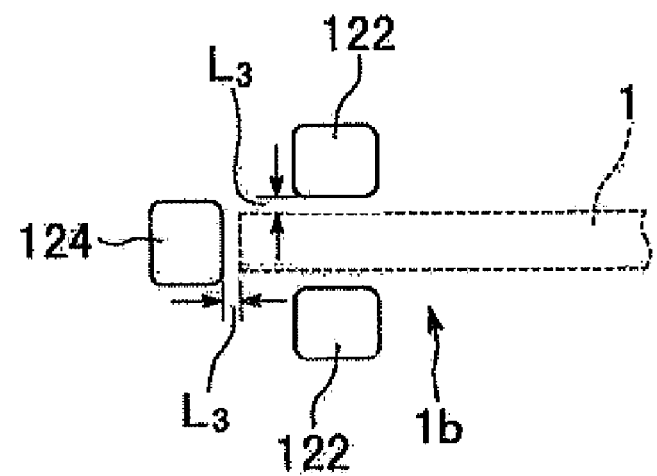

FIG. 3A is a plan view showing a part of the housing area 1a, and FIG. 3B is a plan view showing a part of the housing area 1b. A margin width of the housing area 1b with respect to the semiconductor chip 1 is larger than a margin width of the housing area 1a with respect to the semiconductor chip 1. That is, a spacing $L_3$ between the semiconductor chip 1 and the protruding parts 122 and 124 in a case where the semiconductor chip 1 is positioned at the center of the housing area 1b is larger than a spacing $L_2$ between the semiconductor chip 1 and the protruding parts 112 and 114 in a case where the semiconductor chip 1 is positioned at the center of the housing area 1a. Therefore, when a tray 10 is stacked on a tray 10 of which the housing area 1a on the upper surface houses the semiconductor chip 1, the active face of the semiconductor chip 1 is prevented from being damaged by the protruding parts 122 and 124 provided to the tray 10 positioned upper. Further, when the stacked body of the trays 10 is reversed, the semiconductor chip 1 is easily housed in the housing area 1b.

In order to structure as this, the width of the protruding part 112 is made larger than that of the protruding part 122 in the short side direction of the semiconductor chip 1, and the width of the protruding part 114 is made larger than that of the protruding part 124 in the long side direction of the semiconductor chip 1. It is preferable that a difference between the spacing $L_3$ and the spacing $L_2$ be larger than (more preferably, nearly equal to) the margin width L1 between the rib 116 and the rib 126 shown in FIGS. 2A and 2B.

According to the semiconductor chip housing tray 10 of the first embodiment, the margin width of the housing area 1b with respect to the semiconductor chip 1 is larger than that of the housing area 1a with respect to the semiconductor chip 1. Therefore, when the plurality of semiconductor chip housing trays 10 are stacked, the active face of the semiconductor chip 1 housed in the tray 10 positioned lower is prevented from being damaged by the protruding parts 122 and 124 that are provided to the tray 10 positioned upper.

The distance between the center of the long side of the housing area 1b provided to the under surface and the protruding part 122 is larger than the distance between the center of the long side of the housing area 1a provided to the upper surface and the protruding part 112. Therefore, it is harder for the semiconductor chip 1 housed in the housing area 1b to spin around in the horizontal plane than the semiconductor chip 1 housed in the housing area 1a. Accordingly, the semiconductor chip 1 can be settled in the housing area 1a when it is transferred.

Further, in a case the semiconductor chip housing trays 10 are stacked, the top of the protruding part 112 of the tray 10 positioned lower contacts the under surface of the tray 10 positioned upper, and the bottom of the protruding part 122 of the tray 10 positioned upper contacts the upper surface of the tray 10 positioned lower. Therefore, even if shock or vibration is added to the trays 10, the semiconductor chip 1 is prevented from slipping in between the tray 10 positioned lower and the tray 10 positioned upper and from popping out from the housing area 1a. Accordingly, the semiconductor chip 1 can be further stably settled in the housing area 1a when it is transferred.

Second Embodiment

Figure 4A:
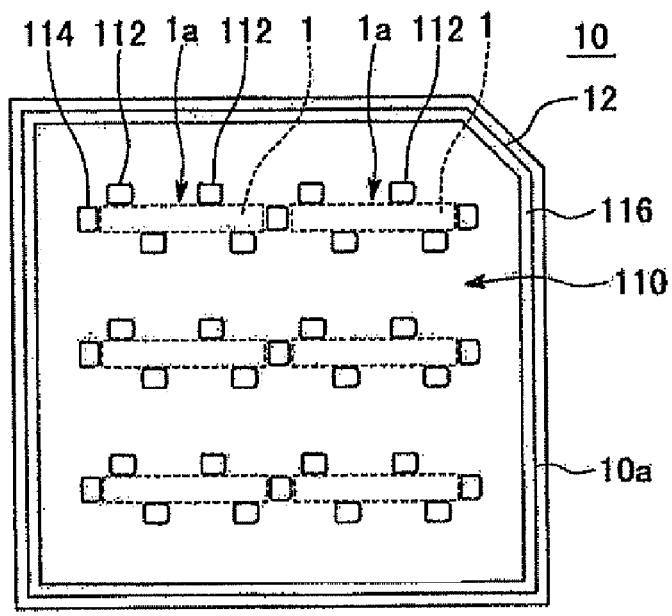
FIG. 4A is a diagram showing an upper surface of a semiconductor chip housing tray 10 according to a second embodiment.
Figure 4B:
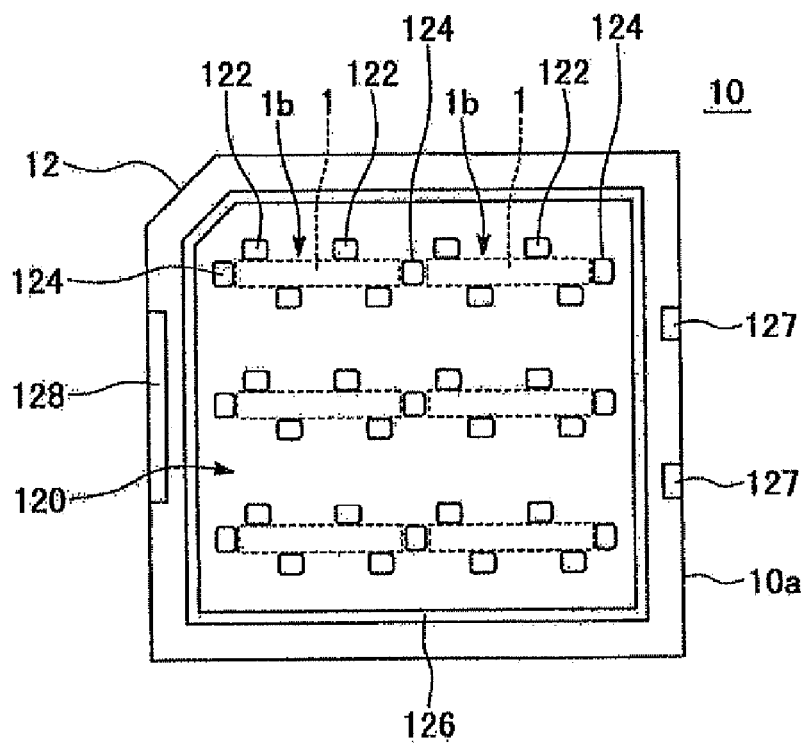
FIG. 4B is a diagram showing an under surface of the semiconductor chip hosing tray 10.

FIGS. 4A and 4B are diagrams respectively showing an upper surface and an under surface of a semiconductor chip housing tray 10 according to a second embodiment. The semiconductor chip housing tray 10 of the second embodiment has the same structure as the semiconductor chip housing tray 10 of the first embodiment except for positions of the protruding parts 112 and 122. Therefore, the positions of the protruding parts 112 and 122 will be mainly described below.

Two protruding parts 112 are provided between housing areas 1a of which long sides are adjacent each other, and the two protruding parts 112 are positioned asymmetrically through the center of the long side of the housing area 1a, in the second embodiment. Further, two protruding parts 112 facing one long side of the housing area 1a and two protruding parts 112 facing the other long side of the housing area 1a are positioned point-symmetrically through the center of the housing area 1a. The protruding parts 122 are positioned in the same manner as the protruding parts 112.

The second embodiment can also provide the same advantageous effect as that of the first embodiment.

Third Embodiment

Figure 5A:
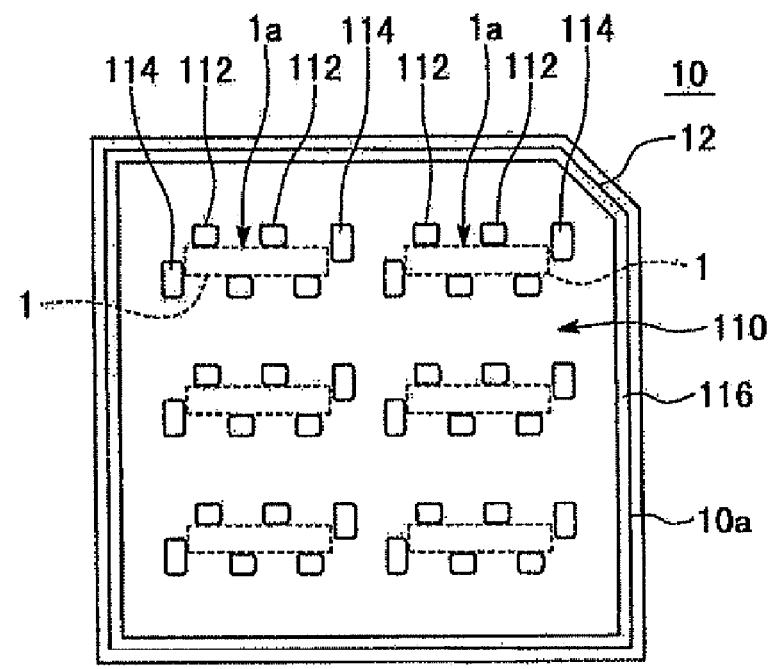
FIG. 5A is a diagram showing an upper surface of a semiconductor chip housing tray 10 according to a third embodiment.
Figure 5B:
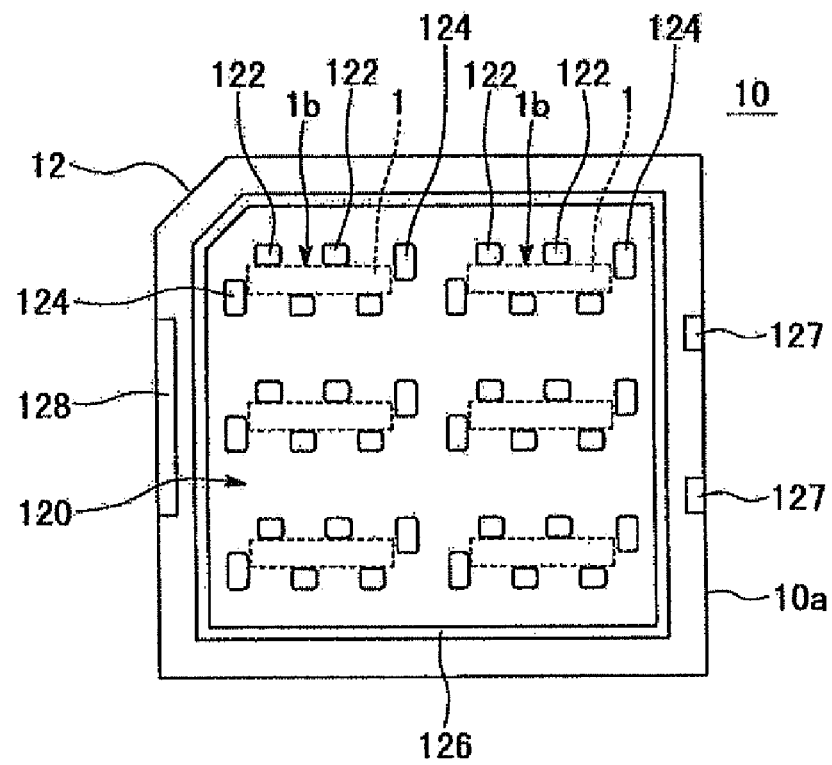
FIG. 5B is a diagram showing an under surface of the semiconductor chip hosing tray 10.

FIGS. 5A and 5B are diagrams respectively showing an upper surface and an under surface of a semiconductor chip housing tray 10 according to a third embodiment. The semiconductor chip housing tray 10 of the third embodiment has the same structure as the semiconductor chip housing tray 10 of the second embodiment except for shapes and positions of the protruding parts 114 and 124. Therefore, the shapes and the positions of the protruding parts 114 and 124 will be mainly described below.

In the third embodiment, the protruding parts 114 and 124 have the same heights as the protruding parts 112 and 122. Further, the protruding parts 114 and 124 are arranged such that the protruding parts 114 of the semiconductor chip housing tray 10 positioned lower and the protruding parts 124 of the semiconductor chip housing tray 10 positioned upper do not contact with each other when a plurality of semiconductor chip housing trays 10 are stacked.

The third embodiment can also provide the same advantageous effect as that of the first embodiment.

Fourth Embodiment

Figure 6A:
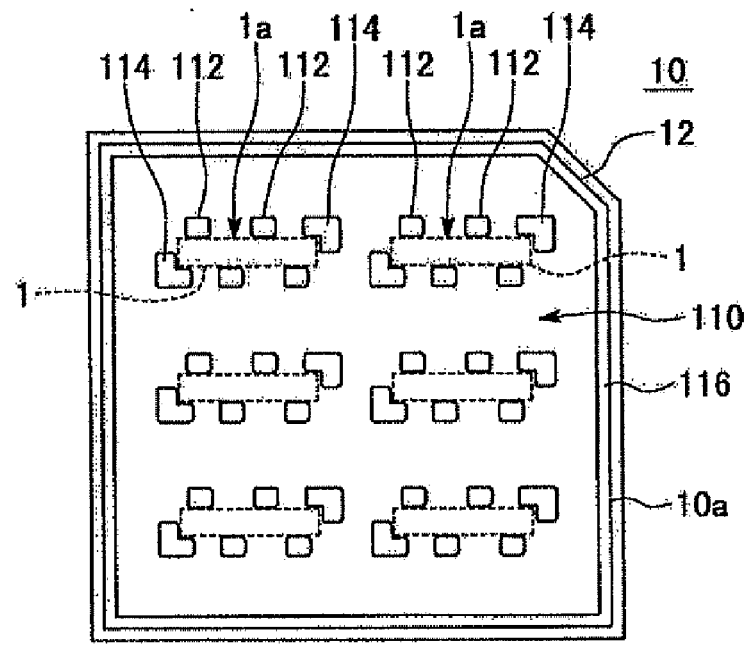
FIG. 6A is a diagram showing an upper surface of a semiconductor chip housing tray 10 according to a fourth embodiment.
Figure 6B:
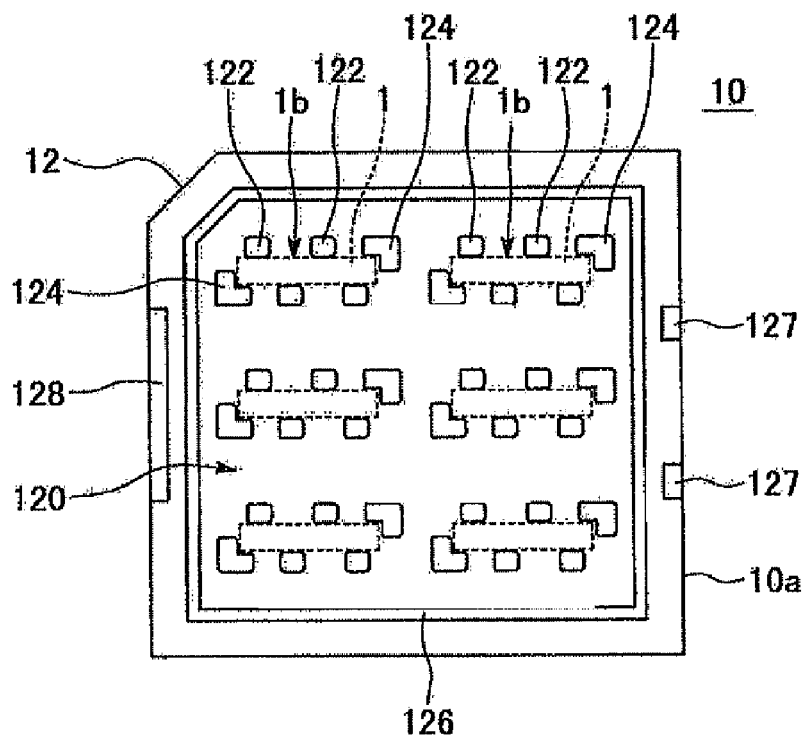
FIG. 6B is a diagram showing an under surface of the semiconductor chip hosing tray 10.
Figure 7A:
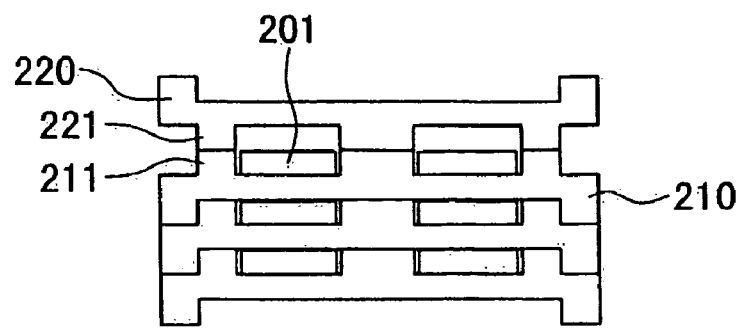
FIGS. 7A and 7B are sectional views for explaining a first example of a semiconductor chip housing tray in related art.
Figure 7B:
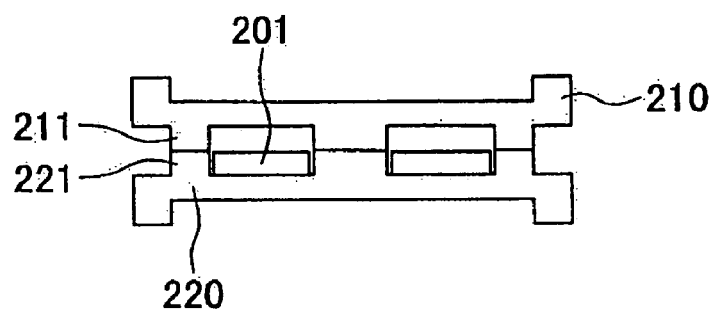
Figure 8A:
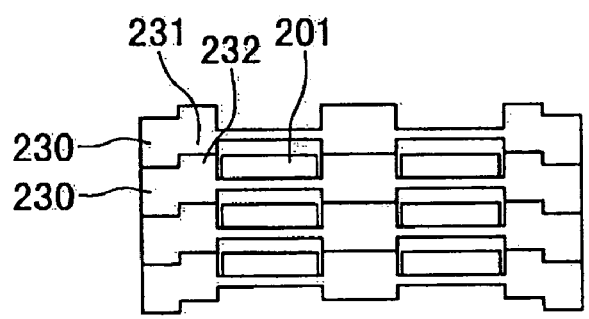
FIGS. 8A and 8B are sectional views for explaining a second example of a semiconductor chip housing tray in related art.
Figure 8B:
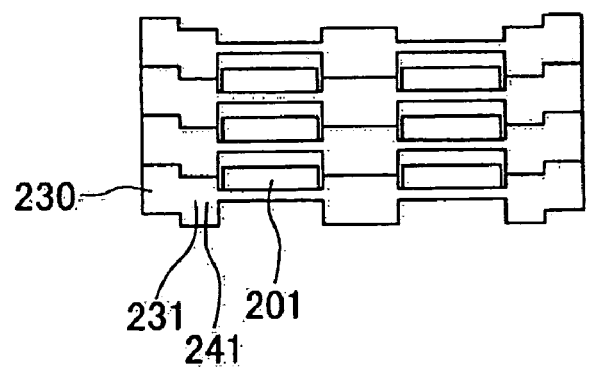

FIGS. 6A and 6B are diagrams respectively showing an upper surface and an under surface of a semiconductor chip housing tray 10 according to a fourth embodiment. The semiconductor chip housing tray 10 of the fourth embodiment has the same structure as the semiconductor chip housing tray 10 of the third embodiment except for shapes of the protruding parts 114 and 124. Therefore, the shapes of the protruding parts 114 and 124 will be mainly described below.

In the fourth embodiment, the protruding parts 114 and 124 have a hook type planar shape, and four corners of the semiconductor chip 1 face any of lateral surfaces of the protruding parts 114 and 124.

The fourth embodiment can also provide the same advantageous effect as that of the first embodiment.

It should be understood that the above-mentioned embodiments and examples are not intended to limit the invention. Various changes and modifications can be made without departing from the spirit and scope of the invention. For example, the planar shape of the semiconductor chip 1 is rectangular in the embodiments described above, but the shape may be square. In a case the semiconductor chip housing trays 10 are stacked, the top of the protruding part 112 of the tray 10 contacts with the under surface of the tray 10 positioned one stage upper, and the bottom of the protruding part 122 of the tray 10 contacts with the upper surface of the tray 10 positioned one stage lower. However, they do not have to contact with each other. Here, it is preferable that the distance between the top of the protruding part 112 of the tray 10 positioned lower and the under surface of the tray 10 positioned upper and the distance between the bottom of the protruding part 122 of the tray 10 positioned upper and the upper surface of the tray 10 positioned lower be smaller than the thickness of the semiconductor chip 1.

In the first embodiment, the sum of the height of the protruding part 114 and the height of the protruding part 124 equals to each of the heights of the protruding parts 112 and 122 and thus the top of the protruding part 114 of the tray 10 contacts with the bottom of the protruding part 124 of the tray 10 positioned one stage upper. However, they do not have to contact with each other. Here, it is preferable that the difference between the sum of the heights of the protruding parts 114 and 124 and each of the heights of the protruding parts 112 and 122, that is, the distance between the top of the protruding part 114 and the bottom of the protruding part 124 be smaller than the thickness of the semiconductor chip 1.

The shapes of the protruding pats 114 and 124 of the first embodiment may be the shapes thereof in the third or fourth embodiment. Further, the number of the protruding parts 112 and 114 for each of the housing areas 1a and the number of the protruding parts 122 and 124 for each of the housing areas 1b are not limited to the embodiments described above

What is claimed is:

1. A semiconductor chip housing tray that houses a plurality of semiconductor chips and is stackable in a plurality of stages with at least an upper housing tray and a lower housing tray that are each substantially identical to the semiconductor chip housing tray, the semiconductor chip housing tray comprising:

a base plate defining an upper surface and an under surface opposite the upper surface;

a plurality of upper surface protruding parts disposed on the upper surface of the base plate, which divide the upper surface of the base plate into a plurality of first semiconductor chip housing areas;

a plurality of under surface protruding parts disposed on the under surface of the base plate, which divide the under surface of the base plate into a plurality of second semiconductor chip housing areas, wherein each of the first semiconductor chip housing areas have a first margin width with respect to a semiconductor chip of the plurality of semiconductor chips and each of the second semiconductor chip housing areas have a second margin width with respect to the semiconductor chip that is greater than the first margin width, the first margin width being a distance between an edge of the semiconductor chip and an edge of a corresponding first semiconductor housing area when the semiconductor chip is centered within the first semiconductor housing area and the second margin width being a distance between an edge of the semiconductor chip and an edge of a corresponding second semiconductor housing area when the semiconductor chip is centered within the second semiconductor housing area, wherein, when the semiconductor chip housing tray is stacked with the lower housing tray, the plurality of second semiconductor chip housing areas overlap corresponding first semiconductor chip housing areas of the lower housing tray, and wherein, when the semiconductor chip housing tray is stacked with the upper housing tray, the plurality of first semiconductor chip housing areas overlap corresponding second semiconductor chip housing areas of the upper housing tray;

wherein, when the semiconductor chip housing tray is stacked with the lower housing tray, a bottom surface of a first under surface protruding part of the under surface protruding parts does not face a top surface of a first upper surface protruding part of the upper surface protruding parts of the lower housing tray;

wherein, when the semiconductor chip housing tray is stacked with the upper housing tray, a top surface of a first upper surface protruding part of the upper surface protruding parts does not face a bottom surface a first under surface protruding part of the under surface protruding parts of the upper housing tray;

wherein, when the semiconductor chip housing tray is stacked with both the upper housing tray and the lower housing tray, each of a distance between the bottom surface of the first under surface protruding part of the under surface protruding parts of the upper housing tray and an upper surface of the semiconductor chip housing tray, and a distance between the top surface of the first upper surface protruding part of the upper surface protruding parts of the lower housing tray and an under surface of the semiconductor chip housing tray is smaller than a thickness of each of the plurality of semiconductor chips;

wherein, a bottom surface of a second under surface protruding part contacts a top surface of a second upper surface protruding part of the lower housing tray;

wherein a sum of a height of the second under surface protruding part of the upper housing tray and a height of the second upper surface protruding part is equal to the height of each of the first under surface protruding part and the first upper surface protruding part; and wherein, each of a height of the first under surface protruding part and a height of the upper surface protruding part is larger than the thickness of each of the plurality of semiconductor chips.

2. The semiconductor chip housing tray according to claim 1,
wherein a planar shape of the semiconductor chips is rectangular,
wherein the plurality of upper surface protruding parts include a plurality of upper surface protruding parts for a long side, the parts for a long side facing a lateral surface at a long side of the semiconductor chips, and a plurality of upper surface protruding parts for a short side, the parts for a short side facing a lateral surface at a short side of the semiconductor chips,
wherein the plurality of under surface protruding parts include a plurality of under surface protruding parts for a long side, the parts for a long side facing a lateral surface at a long side of the semiconductor chips, and a plurality of under surface protruding parts for a short side, the parts for a short side facing a lateral surface at a short side of the semiconductor chips, and
wherein a protruding part that is positioned closest to the short side of the semiconductor chips among the under surface protruding parts for a long side is positioned closer to the short side of the semiconductor chips than a protruding part positioned closest to the short side of the semiconductor chips among the upper surface protruding parts for a long side.

3. The semiconductor chip housing tray according to claim 1,
wherein a planar shape of the semiconductor chips is rectangular,
wherein the plurality of upper surface protruding parts include a plurality of upper surface protruding parts for a long side, the parts for a long side facing a lateral surface at a long side of the semiconductor chips, and a plurality of upper surface protruding parts for a short side, the parts for a short side facing a lateral surface at a short side of the semiconductor chips,
wherein the plurality of under surface protruding parts include a plurality of under surface protruding parts for a long side, the parts for a long side facing a lateral surface at a long side of the semiconductor chips, and a plurality of under surface protruding parts for a short side, the parts for a short side facing a lateral surface at a short side of the semiconductor chips, and
wherein each of a height of the plurality of under surface protruding parts for a short side and a height of the plurality of upper surface protruding parts for a short side is smaller than a half of a distance between the under surface of the semiconductor chip housing tray and the upper surface of the semiconductor chip housing tray positioned one stage lower in a case where the semiconductor chip housing tray is used in the state being stacked in a plurality of stages, and
wherein a bottom of the plurality of under surface protruding parts for a short side faces a top of the upper surface protruding parts for a short side of the semiconductor chip housing tray positioned one stage lower, in a case where the semiconductor chip housing tray is used in the state being stacked in the plurality of stages.

4. The semiconductor chip housing tray according to claim 1, wherein each of the upper surface protruding parts and the under surface protruding parts has a slanted lateral surface and a slant at an end part of the lateral surface is looser than that at other parts of the lateral surface.

5. The semiconductor chip housing tray according to claim 1, wherein any one of a protruding part, a concave part, and a cutout indicating a direction of the semiconductor chip housing tray is provided to a periphery.

6. A method for housing a plurality of semiconductor chips in a plurality of semiconductor chip housing trays, the semiconductor chip housing tray being stackable in a plurality of stages,
the plurality of semiconductor chip housing trays including:
a base plate defining an upper surface and an under surface opposite the upper surface,
a plurality of upper surface protruding parts disposed on the upper surface of the base plate, which divide the upper surface of the base plate into a plurality of first semiconductor chip housing areas, and
a plurality of under surface protruding parts disposed on the under surface of the base plate, which divide the under surface of the base plate into a plurality of second semiconductor chip housing areas, and
the plurality of semiconductor chip housing trays composed of at least a first semiconductor chip housing tray and a second semiconductor chip housing tray,
the method comprising:
housing the plurality of semiconductor chips in each of the first semiconductor chip housing areas provided to the first semiconductor chip housing tray; and
stacking the second semiconductor chip housing tray on the first semiconductor chip housing tray,
wherein in the plurality of semiconductor chip housing trays, each of the plurality of first semiconductor chip housing areas have a first margin width with respect to a semiconductor chip of the plurality of semiconductor chips and each of the second semiconductor chip housing areas have a second margin width with respect to the semiconductor chip that is greater than the first margin width, the first margin width being a distance between an edge of the semiconductor chip and an edge of a corresponding first semiconductor housing area when the semiconductor chip is centered within the first semiconductor housing area and the second margin width being a distance between an edge of the semiconductor chip and an edge of a corresponding second semiconductor housing area when the semiconductor chip is centered within the second semiconductor housing area;
wherein, when the first semiconductor chip housing tray is stacked with the second semiconductor chip housing tray, the plurality of second semiconductor chip housing areas provided to the second semiconductor chip housing tray overlap corresponding first semiconductor chip housing areas provided to the first semiconductor chip housing tray,
wherein, when the first semiconductor chip housing tray is stacked with the second semiconductor chip housing tray, a bottom surface of a first under surface protruding part of the under surface protruding parts provided to the second semiconductor chip housing tray does not face a top surface of a first upper surface protruding part of the upper surface protruding parts provided to the first semiconductor chip housing tray,
wherein, when the first semiconductor chip housing tray is stacked with the second semiconductor chip housing tray, each of a distance between the bottom surface of the first under surface protruding part provided to the second semiconductor chip housing tray and the upper surface of the first semiconductor chip housing tray and a distance between the top surface of the first upper surface protruding part provided to the first semiconductor chip housing tray and the under surface of the second semiconductor chip housing tray is smaller than a thickness of each of plurality of semiconductor chips, wherein, when the first semiconductor chip housing tray is stacked with the second semiconductor chip housing tray, a bottom surface of a second under surface protruding part of the under surface protruding parts contacts a top surface of a second upper surface protruding part of the upper surface protruding parts of the lower housing tray;

wherein a sum of a height of the second under surface protruding part of the under surface protruding parts provided to the second semiconductor chip housing tray and a height of the second upper surface protruding part of the upper surface protruding parts provided to the first semiconductor chip housing tray is equal to a height of each of the first under surface protruding part of the under surface protruding parts and the first upper surface protruding part of the upper surface protruding parts; and wherein, each of the height of the first under surface protruding part of the under surface protruding parts and the height of the first upper surface protruding part of the upper surface protruding parts is larger than the thickness of each of the plurality of semiconductor chips.

7. A semiconductor chip housing tray that houses a plurality of semiconductor chips and is stackable in a plurality of stages with at least an upper housing tray and a lower housing tray that are each substantially identical to the semiconductor chip housing tray, the semiconductor chip housing tray comprising:

a base plate defining an upper surface and an under surface opposite the upper surface;

a plurality of upper surface protruding parts disposed on the upper surface of the base plate, which divide the upper surface of the base plate into a plurality of first semiconductor chip housing areas;

a plurality of under surface protruding parts disposed on the under surface of the base plate, which divide the under surface of the base plate into a plurality of second semiconductor chip housing areas, wherein each of the first semiconductor chip housing areas have a first margin width with respect to a semiconductor chip of the plurality of semiconductor chips and each of the second semiconductor chip housing areas have a second margin width with respect to the semiconductor chip that is greater than the first margin width, the first margin width being a distance between an edge of the semiconductor chip and an edge of a corresponding first semiconductor housing area when the semiconductor chip is centered within the first semiconductor housing area and the second margin width being a distance between an edge of the semiconductor chip and an edge of a corresponding second semiconductor housing area when the semiconductor chip is centered within the second semiconductor housing area, wherein, when the semiconductor chip housing tray is stacked with the lower housing tray, the plurality of second semiconductor chip housing areas overlap corresponding first semiconductor chip housing areas of the lower housing tray, and wherein, when the semiconductor chip housing tray is stacked with the upper housing tray, the plurality of first semiconductor chip housing areas overlap corresponding second semiconductor chip housing areas of the upper housing tray;

wherein, when the semiconductor chip housing tray is stacked with the lower housing tray, a bottom surface of a first under surface protruding part of the under surface protruding parts does not face a top surface of a first upper surface protruding part of the upper surface protruding parts of the lower housing tray;

wherein, when the semiconductor chip housing tray is stacked with the upper housing tray, a top surface of a first upper surface protruding part of the upper surface protruding parts does not face a bottom surface of a first under surface protruding part of the under surface protruding parts of the upper housing tray;

wherein, when the semiconductor chip housing tray is stacked with both the upper housing tray and the lower housing tray, each of a distance between the bottom surface of the first under surface protruding part of the under surface protruding parts of the upper housing tray and an upper surface of the semiconductor chip housing tray, and a distance between the top surface of the first upper surface protruding part of the upper surface protruding parts of the lower housing tray and an under surface of the semiconductor chip housing tray is smaller than a thickness of each of the plurality of semiconductor chips;

wherein, a bottom surface of a second under surface protruding part contacts a top surface of a second upper surface protruding part of the lower housing tray;

wherein the semiconductor chip housing tray and the upper semiconductor chip housing tray, and the semiconductor chip housing tray and the lower semiconductor chip housing tray are each oriented in a same first direction when stacked; and each of a height of the first under surface protruding part and a height of the upper surface protruding part is larger than the thickness of each of the plurality of semiconductor chips.

* * * * *